(12) United States Patent
Shibata et al.

(10) Patent No.: US 11,158,592 B2
(45) Date of Patent: Oct. 26, 2021

(54) SEMICONDUCTOR DEVICE

(71) Applicant: Murata Manufacturing Co., Ltd., Kyoto-fu (JP)

(72) Inventors: Masahiro Shibata, Nagaokakyo (JP); Atsushi Kurokawa, Nagaokakyo (JP)

(73) Assignee: Murata Manufacturing Co., Ltd., Kyoto-fu (JP)

( * ) Notice: Subject to any disclaimer, the term of this patent is extended or adjusted under 35 U.S.C. 154(b) by 47 days.

(21) Appl. No.: 16/710,995

(22) Filed: Dec. 11, 2019

(65) Prior Publication Data
US 2020/0194394 A1    Jun. 18, 2020

(30) Foreign Application Priority Data

Dec. 18, 2018  (JP) .............................. JP2018-236395

(51) Int. Cl.
*H01L 23/00*    (2006.01)
*H01L 23/367*    (2006.01)
(Continued)

(52) U.S. Cl.
CPC ............ *H01L 24/13* (2013.01); *H01L 23/367* (2013.01); *H01L 23/528* (2013.01); *H01L 23/5226* (2013.01); *H01L 24/11* (2013.01); *H01L 27/0823* (2013.01); *H01L 29/205* (2013.01); *H01L 29/41708* (2013.01); *H01L 29/7371* (2013.01); *H01L 29/0847* (2013.01); *H01L 29/42304* (2013.01); *H01L 29/452* (2013.01); *H01L 2224/11849* (2013.01); *H01L 2224/13013* (2013.01); *H01L 2224/13082* (2013.01); *H01L 2224/13083* (2013.01); *H01L 2224/13084* (2013.01); *H01L 2224/13111* (2013.01); *H01L 2224/13139* (2013.01); *H01L 2224/13147* (2013.01); *H01L 2924/014* (2013.01); *H01L 2924/10329* (2013.01);
(Continued)

(58) Field of Classification Search
CPC ....... H01L 23/367–3677; H01L 23/528–5283; H01L 2224/13023; H01L 2224/1308–13084; H01L 21/76885; H01L 2224/1301; H01L 2224/13012–13019
See application file for complete search history.

(56) References Cited

FOREIGN PATENT DOCUMENTS

| JP | H06-349846 A | 12/1994 |
|---|---|---|
| JP | 2005-116963 A | 4/2005 |
| WO | 2011/142013 A1 | 11/2011 |

*Primary Examiner* — Amar Movva
(74) *Attorney, Agent, or Firm* — Studebaker & Brackett PC

(57) ABSTRACT

Transistors including semiconductor regions where operating current flows are provided above a substrate. Operating electrodes of conductive material having thermal conductivity higher than the semiconductor regions and contacting the semiconductor regions to conduct operating current to the semiconductor regions are disposed. A conductor pillar for external connection contains contact regions where the semiconductor regions and the operating electrodes contact, and is electrically connected to the operating electrodes. The contact regions are disposed in a first direction. Each contact region has a planar shape long in a second direction orthogonal to the first direction. A first average distance, obtained by averaging distances in the second direction from each end portion of the contact region in the second direction to an edge of the conductor pillar across the contact regions, exceeds an average distance value in a height direction from the contact region to a top surface of the conductor pillar.

20 Claims, 18 Drawing Sheets

(51) Int. Cl.
*H01L 29/417* (2006.01)
*H01L 23/528* (2006.01)
*H01L 23/522* (2006.01)
*H01L 29/737* (2006.01)
*H01L 29/205* (2006.01)
*H01L 27/082* (2006.01)
*H01L 29/08* (2006.01)
*H01L 29/423* (2006.01)
*H01L 29/45* (2006.01)

(52) U.S. Cl.
CPC ............... *H01L 2924/10337* (2013.01); *H01L 2924/10338* (2013.01); *H01L 2924/13051* (2013.01)

SEMICONDUCTOR DEVICE

CROSS-REFERENCE TO RELATED APPLICATION

This application claims benefit of priority to Japanese Patent Application No. 2018-236395, filed Dec. 18, 2018, the entire content of which is incorporated herein by reference.

BACKGROUND

Technical Field

The present disclosure relates to a semiconductor device.

Background Art

Power amplifiers mainly usable in wireless communication devices are requested to have improved output power, reduction in size, and the like. For example, a transistor such as a heterojunction bipolar transistor (HBT) is used as an amplifying element included in a power amplifier. Improvement of heat dissipation is highly demanded in order to improve output of a power amplifier and to reduce the size of the power amplifier.

Japanese Unexamined Patent Application Publication No. 6-349846 discloses a semiconductor device capable of efficiently dissipating heat generated in a joint portion. In this semiconductor device, a bump electrode is provided over a finger-like vertical structured transistor. The bump electrode has an H-shape in plan view, and a bump width in a non-intrinsic operation part that protrudes from an intrinsic operation part of the transistor is larger than a bump width right above the intrinsic operation part. That is, the bump width right above the intrinsic operating part is relatively narrow.

SUMMARY

In order to improve output of a power amplifier, improvement of heat dissipation is further desired. Accordingly, the present disclosure provides a semiconductor device in which improvement of heat dissipation is possible.

According to an aspect of the present disclosure, there is provided a semiconductor device that includes a substrate, a plurality of transistors provided above the substrate and including semiconductor regions through which an operating current flows, a plurality of operating electrodes made of a conductive material having a higher thermal conductivity than a thermal conductivity of the semiconductor regions, the plurality of operating electrodes being in contact with the plurality of semiconductor regions respectively and conducting the operating current to the semiconductor regions, and a conductor pillar for external connection electrically connected to the plurality of operating electrodes and containing a plurality of contact regions in which the plurality of semiconductor regions and the plurality of operating electrodes are in contact with each other in plan view. The plurality of contact regions is arrayed in a first direction, each of the plurality of contact regions has a planar shape that is long in a second direction orthogonal to the first direction, and a first average distance is equal to or larger than a second average distance. The first average distance is a value obtained by averaging, across the plurality of contact regions, distances in the second direction from respective end portions of the plurality of contact regions in the second direction to an edge of the conductor pillar. The second average distance is an average value of distances in a height direction from the plurality of contact regions to a top surface of the conductor pillar.

Other features, elements, characteristics and advantages of the present disclosure will become more apparent from the following detailed description of preferred embodiments of the present disclosure with reference to the attached drawings.

DETAILED DESCRIPTION

First Example

A semiconductor device according to a first example will be described with reference to FIG. 1 to FIG. 9.

Figure 1:
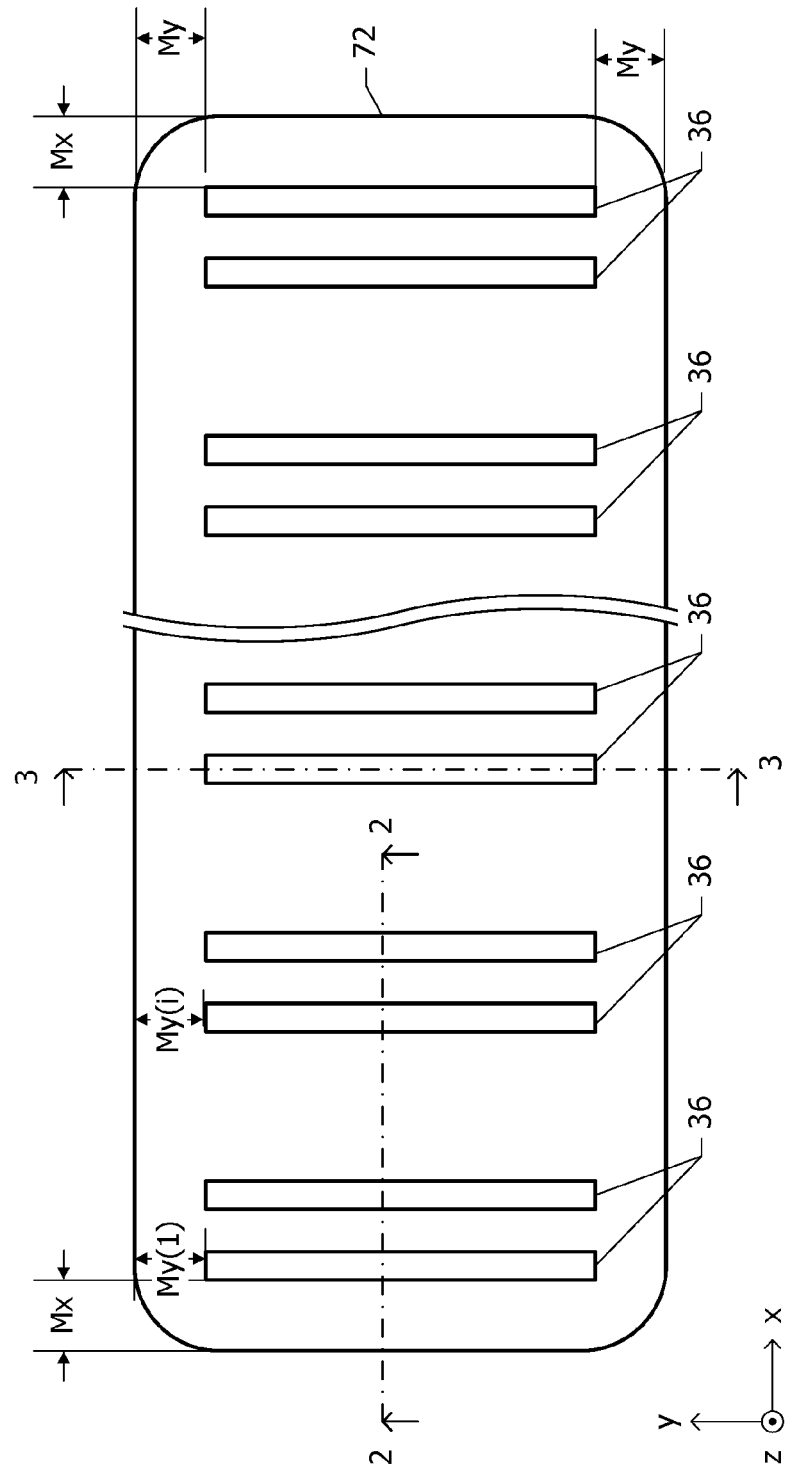
FIG. 1 is a diagram illustrating a planar positional relationship between a top surface of a mesa portion of a transistor disposed above a substrate of a semiconductor device according to a first example, and a conductor pillar of a bump.

FIG. 1 is a diagram illustrating a planar positional relationship between an emitter contact region 36 of a transistor disposed above a substrate of the semiconductor device according to the first example, and a conductor pillar 72 of a bump for external connection. A plurality of emitter contact regions 36 is arrayed in a first direction. Each of the emitter contact regions 36 has a planar shape that is long in a second direction orthogonal to the first direction. For example, the planar shape of each of the emitter contact regions 36 is substantially rectangular. An xyz orthogonal coordinate system is defined in which the first direction is an x-axis direction and the second direction is a y-axis direction.

Respective positions in the y-axis direction at both ends of each of the plurality of emitter contact regions 36 are substantially aligned with each other. Note that, it can be said that the positions are substantially aligned with each other, even when there is positional displacement within an allowable range due to variations in a manufacturing process. A width (dimension in the x-axis direction) of each of the emitter contact regions 36 is, for example, about 3 μm, and a length (dimension in the y-axis direction) thereof is, for example, about 10 μm or more and about 80 μm or less (i.e., from about 10 μm to about 80 μm). A planar shape of the conductor pillar 72 is a substantially rectangular shape with round corners long in the x-axis direction, and the plurality of emitter contact regions 36 is disposed inside the conductor pillar 72 in plan view. For example, a total dimension in the x-axis direction of the plurality of emitter contact regions 36 disposed inside one conductor pillar 72 is equal to or larger than a dimension in the y-axis direction of each of the emitter contact regions 36.

A distance in the x-axis direction from an outer edge of each of the emitter contact regions 36 disposed at both ends with respect to the x-axis direction respectively to an edge of the conductor pillar 72 is denoted by Mx. A distance in the y-axis direction from each of the emitter contact regions 36 to an edge of the conductor pillar 72 is denoted by My.

Figure 2:
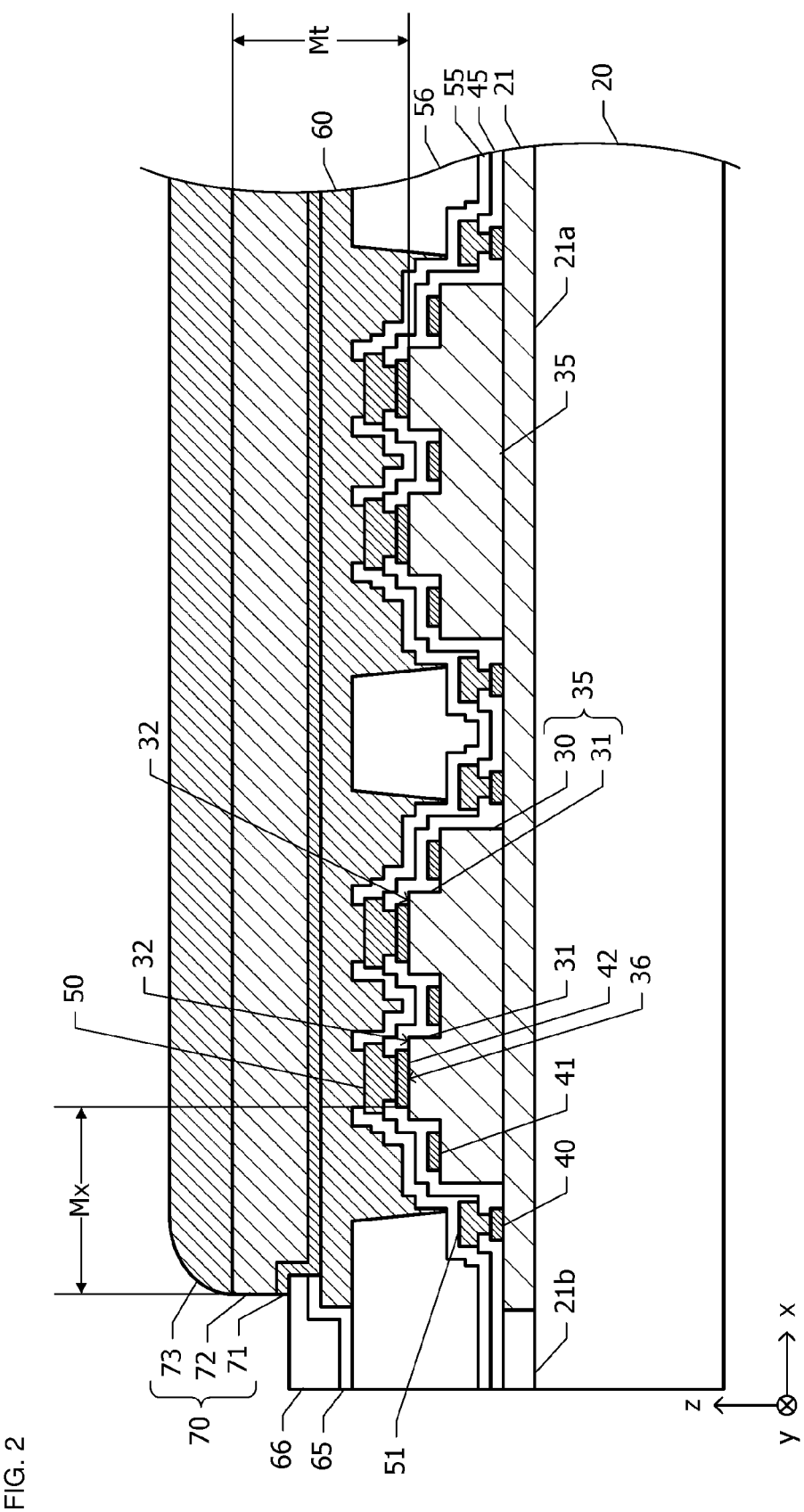
FIG. 2 is a sectional view taken along dashed line 2-2 in FIG. 1.
Figure 3:
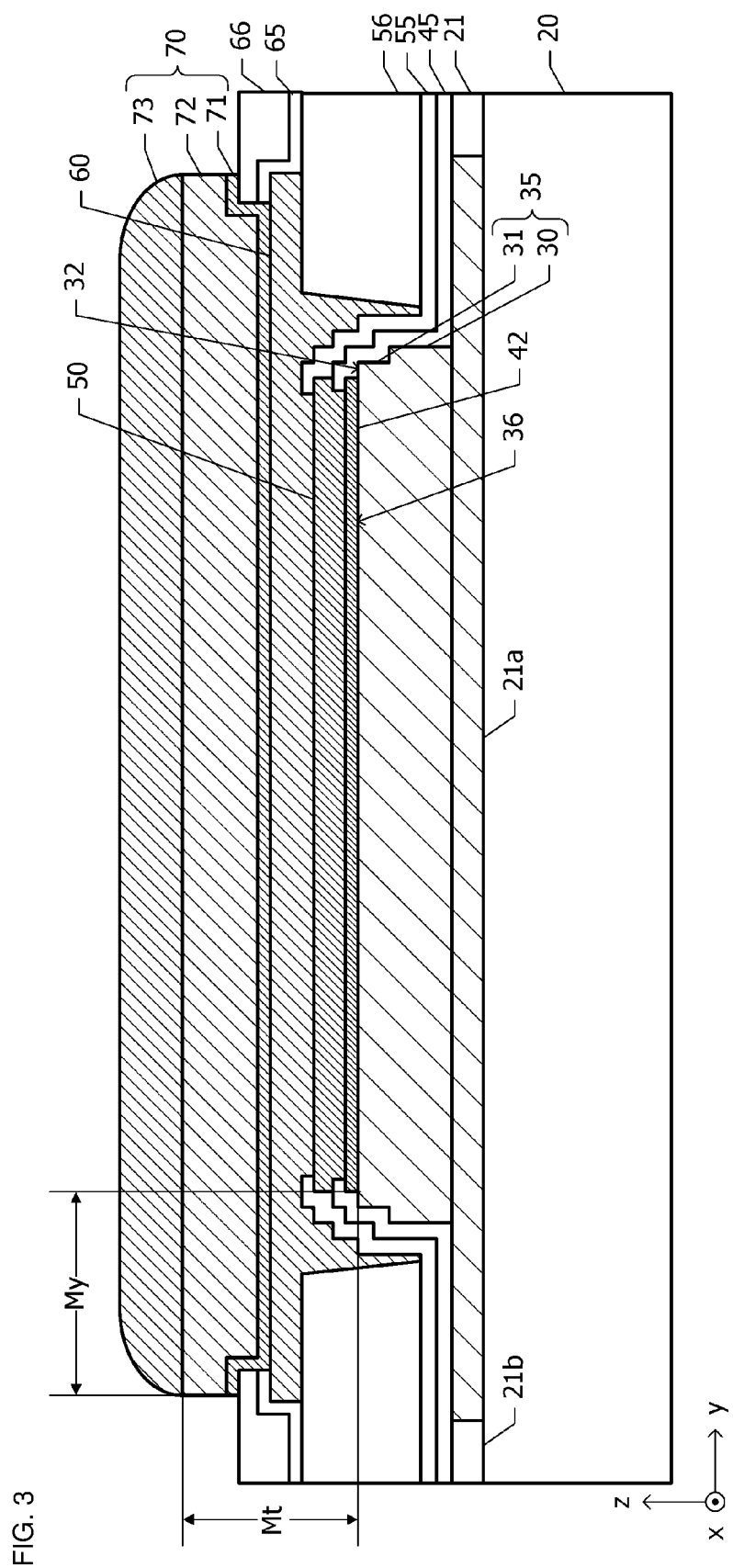
FIG. 3 is a sectional view taken along dashed line 3-3 in FIG. 1.

FIG. 2 and FIG. 3 are sectional views taken along dashed line 2-2 and dashed line 3-3 in FIG. 1, respectively. A sub-collector layer 21 made of GaAs is disposed on a substrate 20 made of semi-insulating GaAs. The sub-collector layer 21 is divided into an element formation region 21a having n-type conductivity and an element isolation region 21b insulated.

A plurality of transistors 35 is disposed above the element formation region 21a. Each of the transistors 35 is a heterojunction bipolar transistor. Each of the plurality of transistors 35 includes a semiconductor region including one lower mesa portion 30 and two upper mesa portions 31 arrayed in the x-axis direction thereon. The lower mesa portion 30 includes a collector layer and a base layer. The upper mesa portion 31 includes an emitter layer.

An emitter electrode 42 is disposed on a top surface 32 of each of the upper mesa portions 31. The emitter electrode 42 is connected to the emitter layer of the transistor 35 in ohmic contact. A region in which the semiconductor region of the transistor 35 and the emitter electrode 42 are in contact with each other is referred to as the emitter contact region 36. A base electrode 41 is disposed in a region of an upper surface of the lower mesa portion 30 in which the upper mesa portion 31 is not disposed. In the section illustrated in FIG. 2, base electrodes 41 are disposed so as to sandwich each of the upper mesa portions 31 in the x-axis direction, and are connected to the base layer of the transistor 35 in ohmic contact. A collector electrode 40 is disposed in a region of an upper surface of the element formation region 21a in which the lower mesa portion 30 is not disposed. The collector electrode 40 is connected in ohmic contact to the collector layer of the transistor 35 with the element formation region 21a of the sub-collector layer 21 interposed therebetween.

An operating current flows through the semiconductor region of the transistor 35 in a thickness direction, between the emitter electrode 42 and the element formation region 21a of the sub-collector layer 21. A base current for controlling magnitude of the operating current flows through the base electrode 41. The emitter electrode 42 functions as an operating electrode for conducting the operating current to the semiconductor region of the transistor 35. The operating electrode is formed of a conductive material, for example metal, having a thermal conductivity higher than that of the semiconductor region of the transistor 35.

An insulating film 45 is disposed so as to cover the sub-collector layer 21, the transistor 35, the collector electrode 40, the base electrode 41, and the emitter electrode 42. Emitter wiring 50 of a first layer and collector wiring 51 are disposed on the insulating film 45. The emitter wiring 50 is connected to the emitter electrode 42 through an opening provided in the insulating film 45. The collector wiring 51 is connected to the collector electrode 40 through an opening provided in the insulating film 45.

An insulating film 55 is disposed so as to cover the insulating film 45, the emitter wiring 50, and the collector wiring 51, and an insulating film 56 is disposed thereon. The insulating film 55 on a lower side is formed of an inorganic insulating material such as SiN, and the insulating film 56 on an upper side is formed of an organic insulating material such as polyimide or benzocyclobutene. An upper surface of the insulating film 56 is planarized.

An opening for exposing part of the emitter wiring 50 of the first layer is provided in the insulating film 55 on the lower side. An opening containing the transistor 35 in plan view is provided in the insulating film 56 on the upper side. The opening provided in the insulating film 55 on the lower side is included in the opening provided in the insulating film 56 on the upper side. Emitter wiring 60 of a second layer is disposed on the insulating films 55 and 56. The emitter wiring 60 of the second layer is connected to the emitter wiring 50 of the first layer through the openings provided in the insulating films 56 and 55, respectively.

Protective films 65 and 66 are disposed so as to cover the insulating film 56 and the emitter wiring 60 of the second layer. The protective film 65 on a lower side is formed of an inorganic insulating material such as SiN, and the protective film 66 on an upper side is formed of an organic insulating material such as polyimide or benzocyclobutene. An opening for exposing the emitter wiring 60 of the second layer is provided in each of the protective films 65 and 66.

A bump 70 is disposed on the protective film 66, and on the emitter wiring 60 in the opening. The bump 70 has three-layer structure in which an under-bump metal layer 71, the conductor pillar 72, and a solder layer 73 are stacked in this order. A refractory metal such as Ti, TiW or the like is used for the under-bump metal layer 71. Copper (Cu), for example, is used for the conductor pillar 72. Solder containing Sn such as tin (Sn) or SnAg is used for the solder layer 73.

The bump 70 and a land of a module substrate (mounting substrate) are connected to each other by solder, so that the semiconductor device is electrically and mechanically connected to the module substrate. During operation of the transistor 35, carriers are injected from the emitter electrode 42. In other words, an operating current flows mainly from the sub-collector layer 21 to the emitter electrode 42 in a height direction of the transistor 35. Thus, when the transistor 35 is used as a power transistor for signal amplification, the upper mesa portion 31 is mainly a heat source. Heat generated in the upper mesa portion 31 is dissipated to the module substrate through a heat dissipation path formed by the emitter electrode 42, the emitter wiring 50 of the first layer, the emitter wiring 60 of the second layer, the under-bump metal layer 71, the conductor pillar 72, and the solder layer 73.

Next, a preferred configuration for ensuring good heat dissipation characteristics will be described below.

Heat generated in the upper mesa portion 31 is transmitted from the top surface 32 of the upper mesa portion 31 toward the bump 70 in the height direction (the z-axis direction), and is diffused in a direction parallel to a substrate surface (xy plane). Since the emitter electrode 42 is formed of a conductive material having a high thermal conductivity, particularly most of the heat passes through the emitter contact region 36, so that the heat is transmitted toward the bump 70. Accordingly, it is preferable for a metal portion which is disposed between the emitter contact region 36 and the solder layer 73 and has a high thermal conductivity to function as a heat spreader. In particular, a positional relationship between the conductor pillar 72 having a relatively large dimension in the height direction (z-axis direction), and the emitter contact region 36 through which the most heat passes has a large influence on the heat dissipation characteristics. In order to efficiently dissipate heat from a heating element, it is preferable that a heat spreader spread in a direction inclined by 45 degrees with respect to a direction normal to a surface of the heat spreader to which the heating element is attached (corresponding to the emitter contact region 36 in the present example).

A preferred positional relationship between the conductor pillar 72 and the emitter contact region 36 will be described below.

As illustrated in FIG. 1, a distance in the y-axis direction from an end portion in the y-axis direction of the i-th emitter contact region 36 to the edge of the conductor pillar 72 is denoted by My(i). A value obtained by averaging the distances My(i) across the plurality of emitter contact regions 36 included in one conductor pillar 72 is referred to as a first average distance My. In the case of the first example, since the distances My(i) are constant for all of the emitter contact regions 36, thus My=My(i) is established.

A third average distance, that is an average value of distances in the x-axis direction from the emitter contact regions 36 located at both the respective ends in the X-axis direction to the edge of the conductor pillar 72, is denoted by Mx (FIG. 1 and FIG. 2). In the first example, since the emitter contact region 36 is substantially rectangular long in the y-axis direction, and the edge of the conductor pillar 72 is also parallel to the y-axis direction, the third average distance Mx is equal to an interval between each of the emitter contact regions 36 located at both the respective ends, and the edge of the conductor pillar 72.

A second average distance, that is an average value of distances in the height direction (z-axis direction) from the emitter contact regions 36 to the top surface of the conductor pillar 72, is denoted by Mt (FIG. 2 and FIG. 3). In the first example, the emitter contact region 36 and the top surface of the conductor pillar 72 are both perpendicular to the z axis. In this case, the second average distance Mt in the height direction is equal to the interval between the emitter contact region 36 and the top surface of the conductor pillar 72.

In order to provide a sufficient function as a heat spreader to the conductor pillar 72, it is preferable that the first average distance My be set to equal to or larger than the second average distance Mt. With this configuration, the conductor pillar 72 functions as a heat dissipation path for heat conducted in a direction within 45 degrees with respect to the z-axis direction. As a result, the conductor pillar 72 can sufficiently function as a heat spreader.

Further, it is preferable that the third average distance Mx be set to equal to or larger than the second average distance Mt. By adopting this configuration, the conductor pillar 72 can sufficiently function as a heat spreader for heat generated in the upper mesa portion 31 located at an end portion with respect to the x-axis direction, passing through the emitter contact region 36, and transmitted upward while diffusing in the x-axis direction.

A heat dissipation path from the emitter contact region 36 to the top surface of the conductor pillar 72 includes, in addition to the conductor pillar 72, the emitter electrode 42, the emitter wiring 50 of the first layer, the emitter wiring 60 of the second layer, and the under-bump metal layer 71. Although the insulating films 45 and 55 (FIG. 2 and FIG. 3) enter part of the heat dissipation path from the emitter contact region 36 to the top surface of the conductor pillar 72 in some cases, the insulating films 45 and 55 are usually sufficiently thinner than a dimension in the height direction of the metal portion such as the conductor pillar 72. Thus, an influence of the insulating films 45 and 55 on the heat dissipation characteristics can be substantially ignored.

The plurality of emitter contact regions 36 (FIG. 1) defined on the top surface 32 (FIG. 2 and FIG. 3) of the upper mesa portion 31 as a heat source is disposed in the x-axis direction. When attention is paid to a heat dissipation path in which diffusion occurs from a heat source in the y-axis direction, heat flows from a plurality of heat sources interfere with each other, so that temperature rise is promoted in some cases. In order to enhance a heat dissipation effect against heat diffused in the y-axis direction from the heat source, it is preferable that the first average distance My be set to equal to or larger than the third average distance Mx.

Next, a method of manufacturing the semiconductor device according to the first example will be described with reference to FIG. 4 to FIG. 9. FIG. 4 to FIG. 9 are sectional views of the semiconductor device according to the first example in a state in the middle of manufacturing. Note that, materials, dimensions and the like of constituent elements of the semiconductor device described below are examples.

Figure 4:
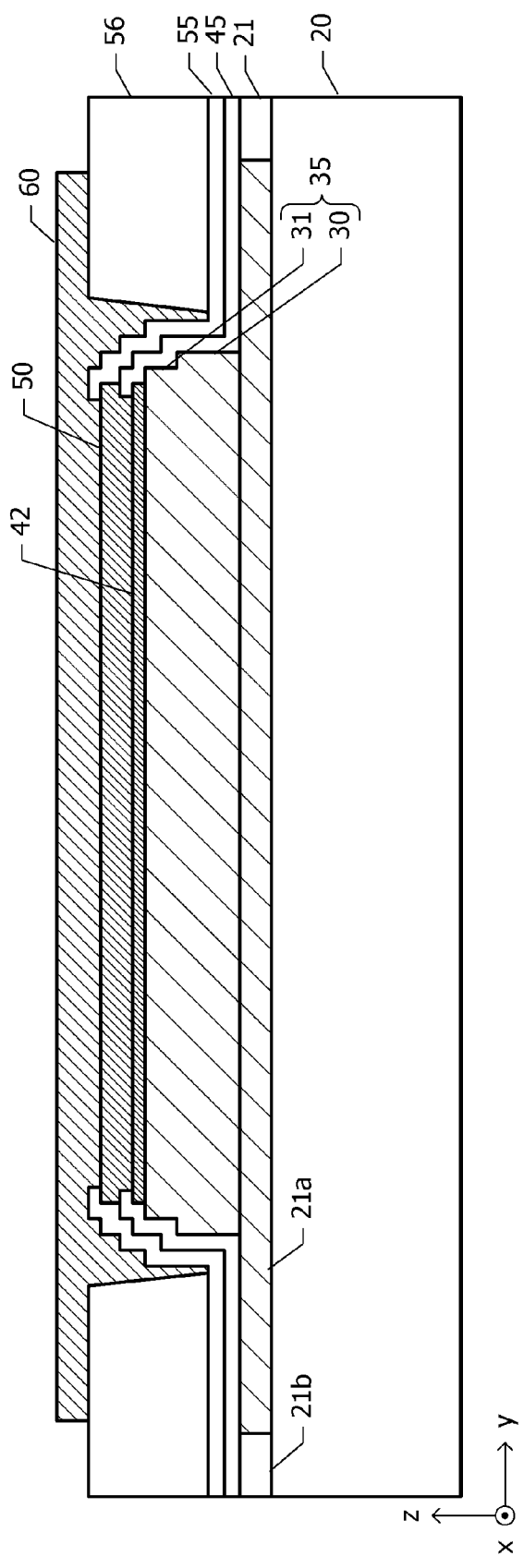
FIG. 4 is a sectional view of the semiconductor device according to the first example in a stage in the middle of manufacturing.

As illustrated in FIG. 4, the sub-collector layer 21, the transistor 35, and the emitter electrode 42 are formed on the substrate 20 made of semi-insulating GaAs by using common semiconductor processes. The element formation region 21a of the sub-collector layer 21 is formed of high concentration n-type GaAs, and a thickness thereof is about 0.5 µm. The element isolation region 21b is formed by performing ion implantation for imparting insulation property to GaAs.

The lower mesa portion 30 constituting the transistor 35 includes a collector layer formed of n-type GaAs and a base layer formed of p-type GaAs. The upper mesa portion 31 constituting the transistor 35 includes an emitter layer formed of n-type InGaP, and an emitter mesa layer disposed thereon. The emitter mesa layer includes a high concentration n-type GaAs layer, and a high concentration n-type InGaAs layer disposed thereon. The emitter mesa layer is a layer for making ohmic contact with the emitter electrode 42 thereon.

The emitter electrode 42 is made of Ti and has a thickness of about 50 nm. Although not illustrated in the section in FIG. 4, the base electrode 41 and the collector electrode 40 (FIG. 2) are further formed. The base electrode 41 is composed of three layers of a Ti film, a Pt film, and a Au film stacked in this order from a bottom. The collector electrode 40 is composed of three layers of a AuGe film, a Ni film, and a Au film stacked in order from the bottom.

The insulating film 45 is formed so as to cover the sub-collector layer 21, the lower and upper mesa portions 30 and 31, and the emitter electrode 42. SiN is used for the insulating film 45. Thereafter, an opening is formed in the insulating film 45 to expose the emitter electrode 42.

The emitter wiring 50 of the first layer is formed on the emitter electrode 42 exposed in the opening formed in the insulating film 45, and on the insulating film 45. Note that, at the same time as the emitter wiring 50, base wiring, collector wiring, and the like are also formed. The emitter wiring 50 is composed of two layers of a Ti film having a thickness of about 10 nm or more and about 50 nm or less (i.e., from about 10 nm to about 50 nm), and a Au film disposed thereon and having a thickness of about 1 µm or more and about 2 µm or less (i.e., from about 1 µm to about 2 µm).

The insulating films 55 and 56 are formed so as to cover the insulating film 45 and the emitter wiring 50. SiN is used for the insulating film 55, and resin such as polyimide or benzocyclobutene is used for the insulating film 56. Openings for exposing part of the emitter wiring 50 of the first layer are formed in the insulating films 56 and 55, respectively. The emitter wiring 60 of the second layer is formed on the emitter wiring 50 of the first layer and the insulating films 55 and 56. The emitter wiring 60 of the second layer is composed of two layers of a Ti film having a thickness of about 10 nm or more and about 50 nm or less (i.e., from about 10 nm to about 50 nm), and a Au film disposed thereon and having a thickness of about 4 µm.

Figure 5:
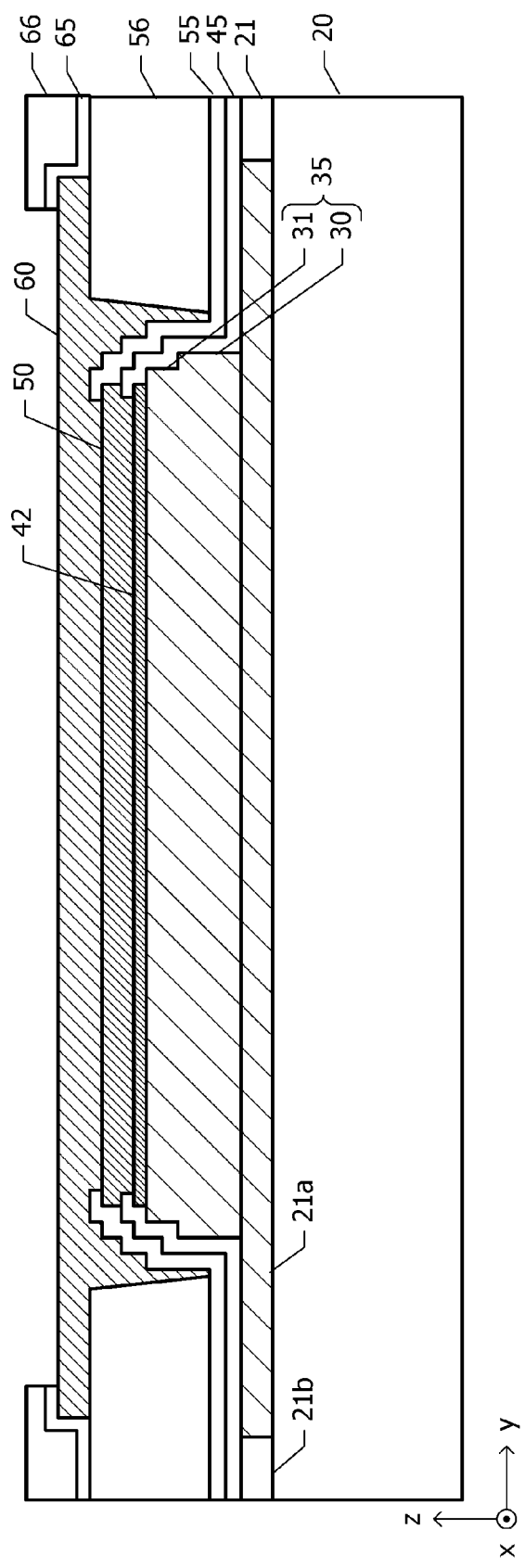
FIG. 5 is a sectional view of the semiconductor device according to the first example in a stage in the middle of manufacturing.

As illustrated in FIG. 5, the protective films 65 and 66 are formed so as to cover the emitter wiring 60 and the insulating film 56. The protective film 65 is formed of SiN and has a thickness of about 0.5 µm. The protective film 66 thereon is formed of resin and has a thickness of about 5 µm. Openings for exposing the emitter wiring 60 of the second layer are formed in the protective films 65 and 66, respectively. Different etching masks may be used to form the opening in the protective film 66 and to form the opening in the protective film 65 respectively, or the same etching mask may be used.

Figure 6:
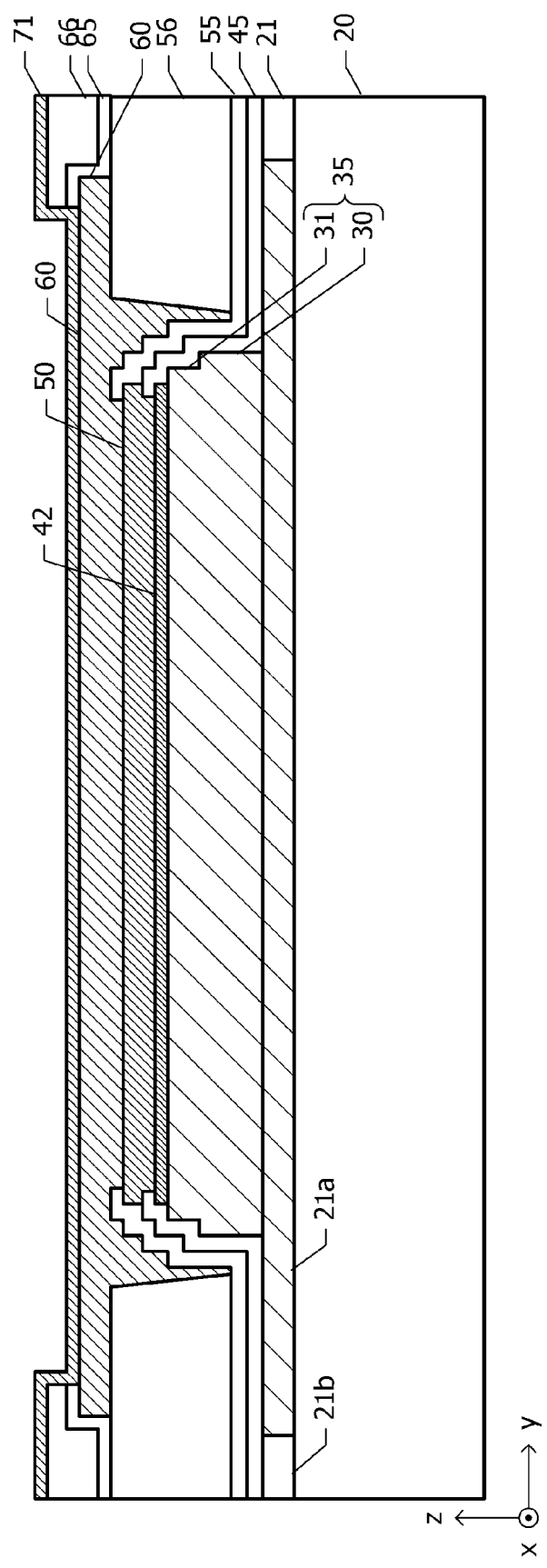
FIG. 6 is a sectional view of the semiconductor device according to the first example in a stage in the middle of manufacturing.

As illustrated in FIG. 6, the under-bump metal layer 71 is formed so as to cover the protective film 66 and the emitter wiring 60 in the opening of the protective film 66. The under-bump metal layer 71 is composed of two layers of a TiW film having a thickness of about 0.3 µm and a Cu film thereon having a thickness of about 0.3 µm.

Figure 7:
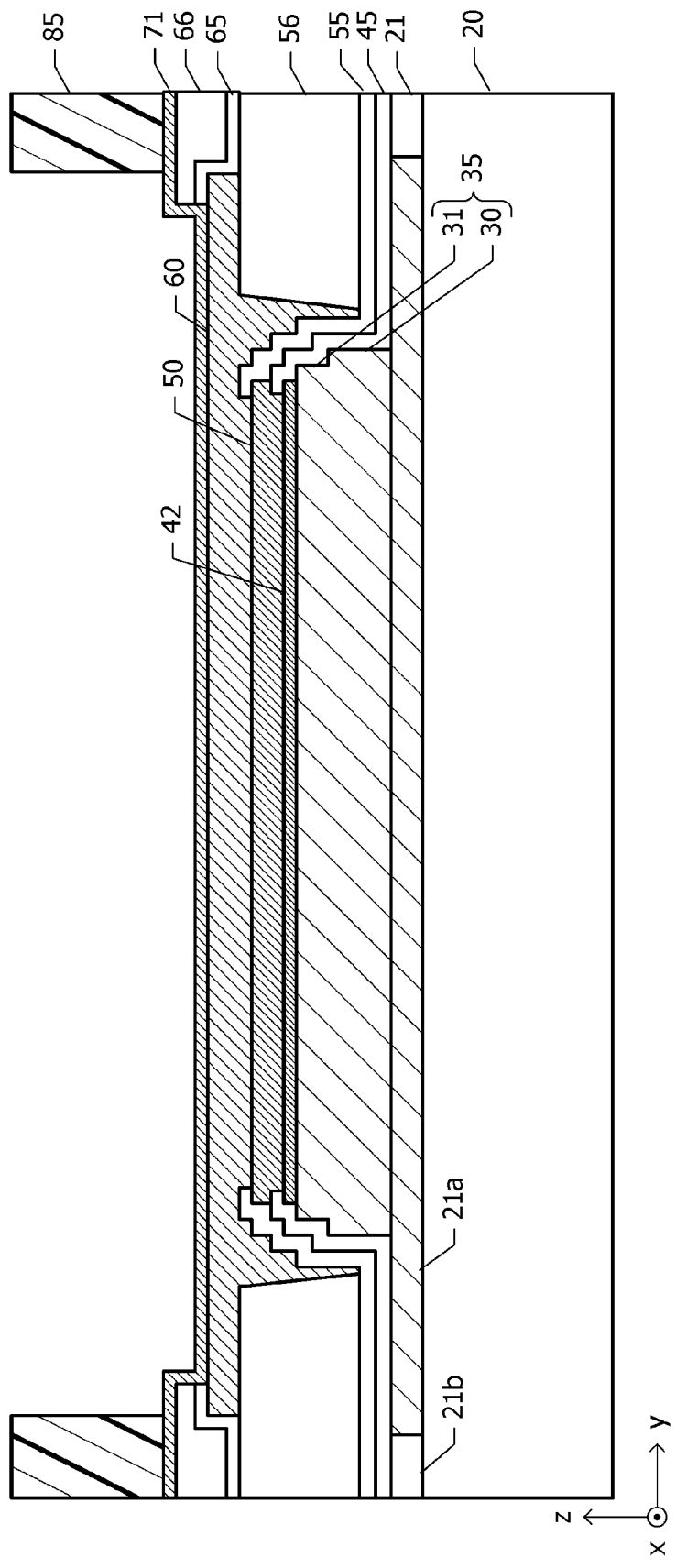
FIG. 7 is a sectional view of the semiconductor device according to the first example in a stage in the middle of manufacturing.

As illustrated in FIG. 7, a resist film 85 having an opening in a region in which the bump 70 (FIG. 1, FIG. 2, and FIG. 3) is to be formed is formed on the under-bump metal layer 71. The under-bump metal layer 71 is exposed in the opening in the resist film 85.

Figure 8:
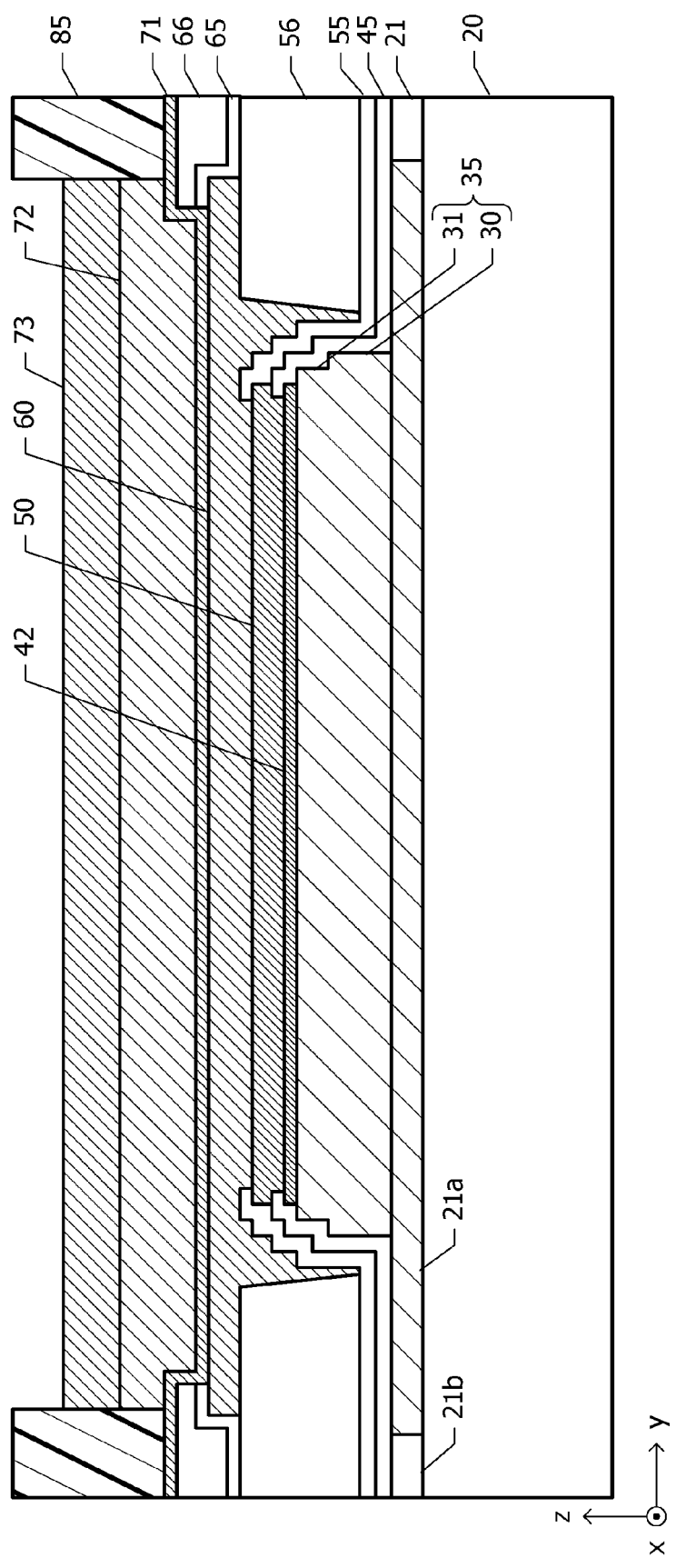
FIG. 8 is a sectional view of the semiconductor device according to the first example in a stage in the middle of manufacturing.

As illustrated in FIG. 8, the conductor pillar 72 and the solder layer 73 are deposited by a plating method on the under-bump metal layer 71 exposed in the opening in the resist film 85. The conductor pillar 72 is formed of Cu, and has a thickness of about 40 µm. The solder layer 73 is formed of a SnAg alloy, and has a thickness of about 30 µm. After the conductor pillar 72 and the solder layer 73 are formed, the resist film 85 is removed.

Figure 9:
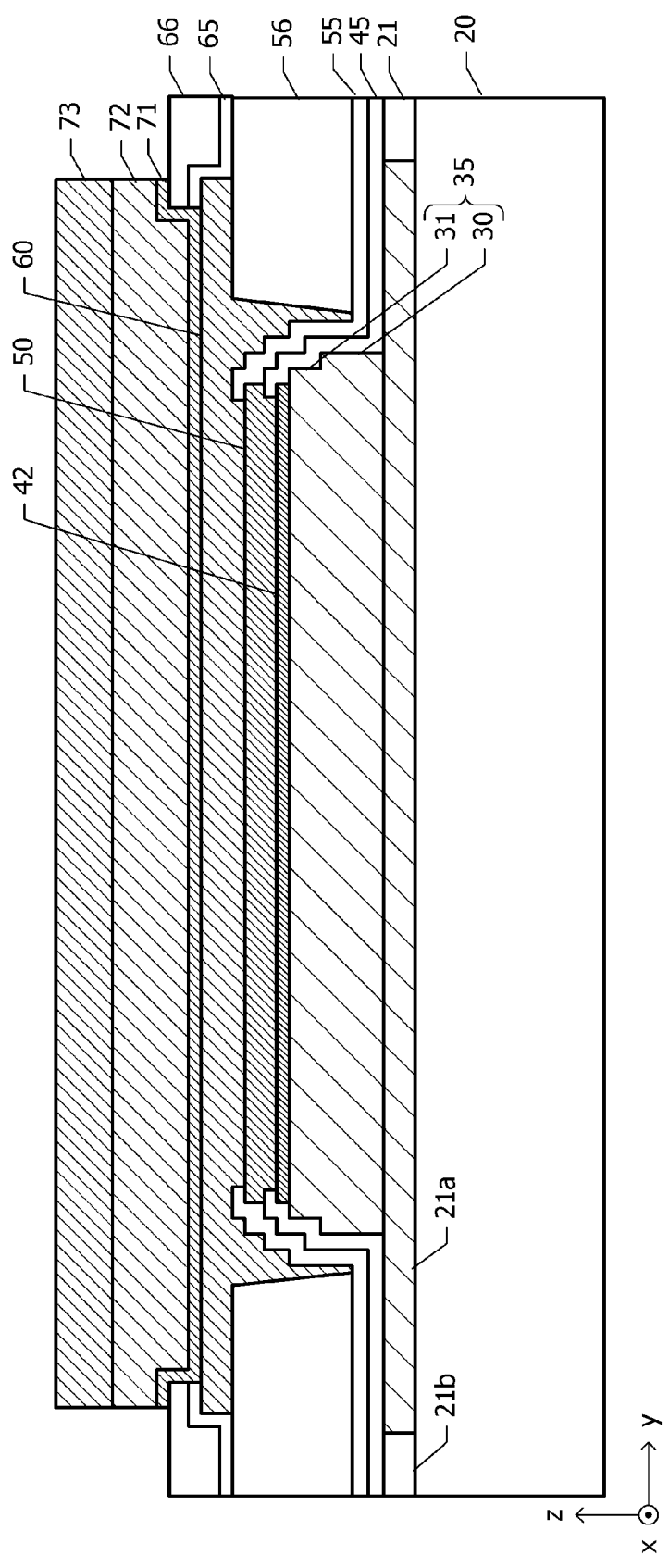
FIG. 9 is a sectional view of the semiconductor device according to the first example in a stage in the middle of manufacturing.

As illustrated in FIG. 9, the under-bump metal layer 71 in a region covered with the resist film 85 (FIG. 8) is removed Immediately under the conductor pillar 72, the under-bump metal layer 71 is left. By performing a reflow process, the solder layer 73 is melted, and then solidification is performed, thereby obtaining the semiconductor device illustrated in FIG. 2 and FIG. 3.

Next, an advantage of the first example will be described.

By setting the first average distance My (FIG. 3) to be equal to or larger than the second average distance Mt, a sufficient heat dissipation path can be ensured for heat diffused in the y-axis direction. By setting the third average distance Mx (FIG. 2) to be equal to or larger than the second average distance Mt, a sufficient heat dissipation path can be ensured for heat diffused in the x-axis direction. As a result, good heat dissipation characteristics can be obtained.

Further, by setting the first average distance My to be equal to or larger than the third average distance Mx, an influence of mutual interference of heat flows from a plurality of heat sources arrayed in the x-axis direction can be reduced. As a result, even when mutual interference of heat flows occurs, sufficient heat dissipation characteristics can be ensured.

Next, a modification of the first example will be described.

In the first example, the first average distance My of distances from the plurality of emitter contact regions 36 arrayed in the x-axis direction to one edge of the conductor pillar 72, and the first average distance My of distances from the plurality of emitter contact regions 36 arrayed in the x-axis direction to another edge are set to be equal to each other. When both the average distances are different from each other, it is preferable that a smaller value of the first average distances My be set to be equal to or larger than the second average distance Mt. Similarly, as for the third average distances Mx as well, it is preferable that a smaller value be set to be equal to or larger than the second average distance Mt.

In the first example, a configuration is adopted in which one transistor includes one lower mesa portion 30 (FIG. 2) and two upper mesa portions 31 on the lower mesa portion 30 (FIG. 2), but the number of upper mesa portions 31 disposed on the lower mesa portion 30 (FIG. 2) may be one. That is, the number of emitter contact regions 36 may be one. In addition, in the first example, a heterojunction bipolar transistor is used as the transistor 35, but other transistors such as a normal bipolar transistor, a field effect transistor (FET), and the like may also be used. When a FET is used as the transistor 35, it is preferable that source and drain contact regions be adopted instead of the emitter contact region 36.

Second Example

Next, a semiconductor device according to a second example will be described with reference to FIG. 10. Hereinafter, description for structure common to that of the semiconductor device according to the first example will be omitted.

Figure 10:
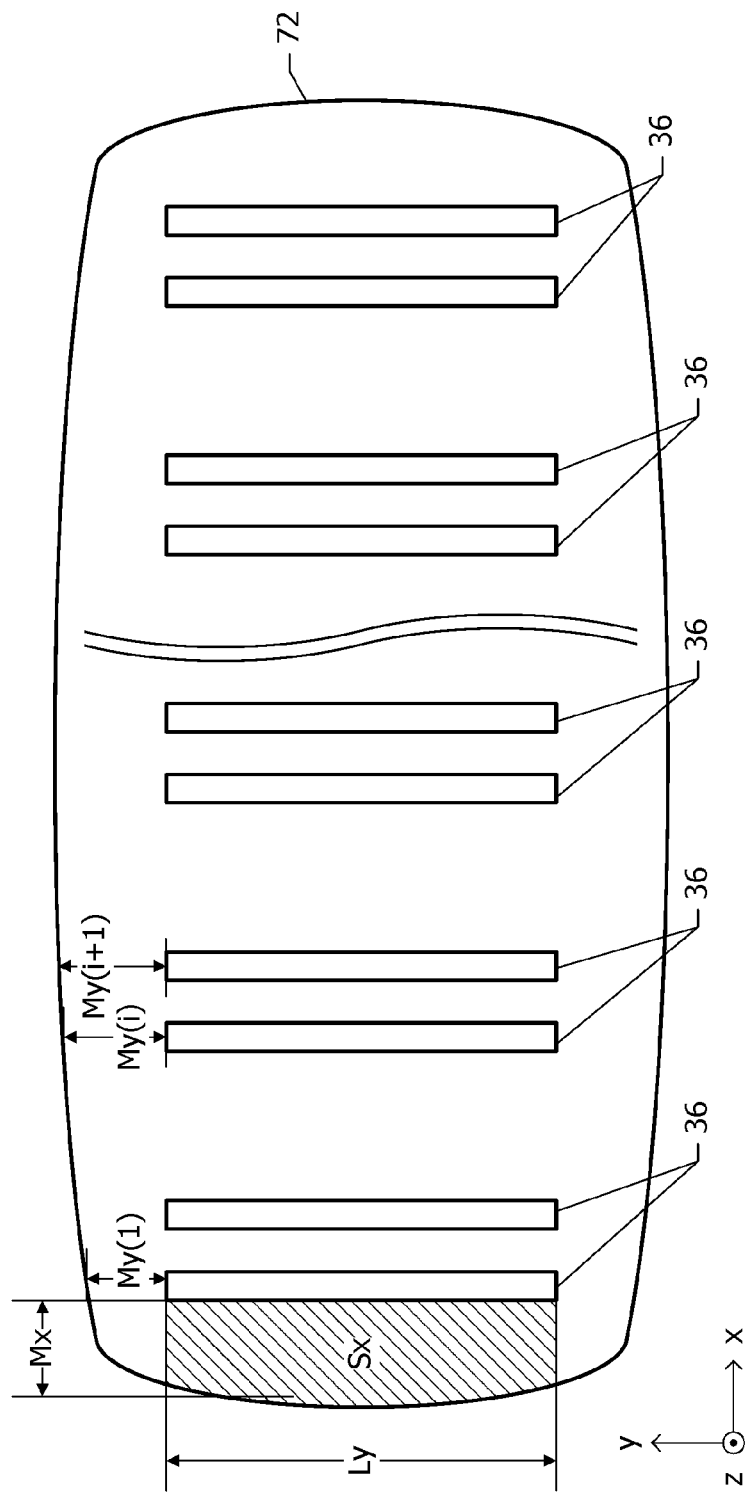
FIG. 10 is a diagram illustrating a planar positional relationship between a top surface of a mesa portion of a transistor disposed above a substrate of a semiconductor device according to a second example, and a conductor pillar of a bump.

FIG. 10 is a diagram illustrating a planar positional relationship between the emitter contact region 36 of a transistor disposed above a substrate of the semiconductor device according to the second example, and the conductor pillar 72 of a bump. In the first example, the planar shape of the conductor pillar 72 is the substantially rectangular shape with round corners. In the second example, a planar shape is a shape obtained by curving short sides and long sides of a rectangle outward. Thus, a distance in the x-axis direction from the emitter contact region 36 located at an end portion in the x-axis direction to an edge of the conductor pillar 72 is not constant with respect to the y-axis direction. Similarly, the distance My(i) in the y-axis direction from an end portion of the emitter contact region 36 to an edge of the conductor pillar 72 is not constant.

A method of determining the third average distance Mx in a case in which the distance in the x-axis direction from the emitter contact region 36 to the edge of the conductor pillar 72 is not constant will be described. An area of a region (a region with hatching rising to the right in FIG. 10, hereinafter, referred to as an "end portion projecting region") surrounded by two imaginary straight lines passing through both the edges in the y-axis direction of the emitter contact region 36 located at an edge in the x axis direction respectively and parallel to the x-axis, the edge of the emitter contact region 36, and the edge of the conductor pillar 72 is denoted by Sx. A dimension in the y-axis direction of the emitter contact region 36 is denoted by Ly. Here, the third average distance Mx is expressed as Mx=Sx/Ly.

Next, a method of determining the first average distance My in a case in which the distance My(i) in the y-axis direction from the end portion of the emitter contact region 36 to the edge of the conductor pillar 72 is not constant will be described. Since the edge in a longitudinal direction of the conductor pillar 72 is curved, the distance My(i) in the y-axis direction from the end portion of the emitter contact region 36 to the edge of the conductor pillar 72 is not constant. In this case, it is sufficient that an average value of the distances My(i) for all the emitter contact regions 36 is set to the first average distance My.

Next, an advantage of the second example will be described.

Also in the second example, by setting the first average distance My, the second average distance Mt, and the third average distance Mx to satisfy the same relationship as that in the first example, good heat dissipation characteristics can be ensured.

Next, a first modification of the second example will be described with reference to FIG. 11.

In the second example, the third average distance Mx in one long side of the conductor pillar 72 and the first average distance My in one short side have been described. In the first modification of the second example, a configuration will be described in which the third average distances Mx on respective two short sides are different from each other, and the first average distances My on respective two long sides are different from each other.

Figure 11:
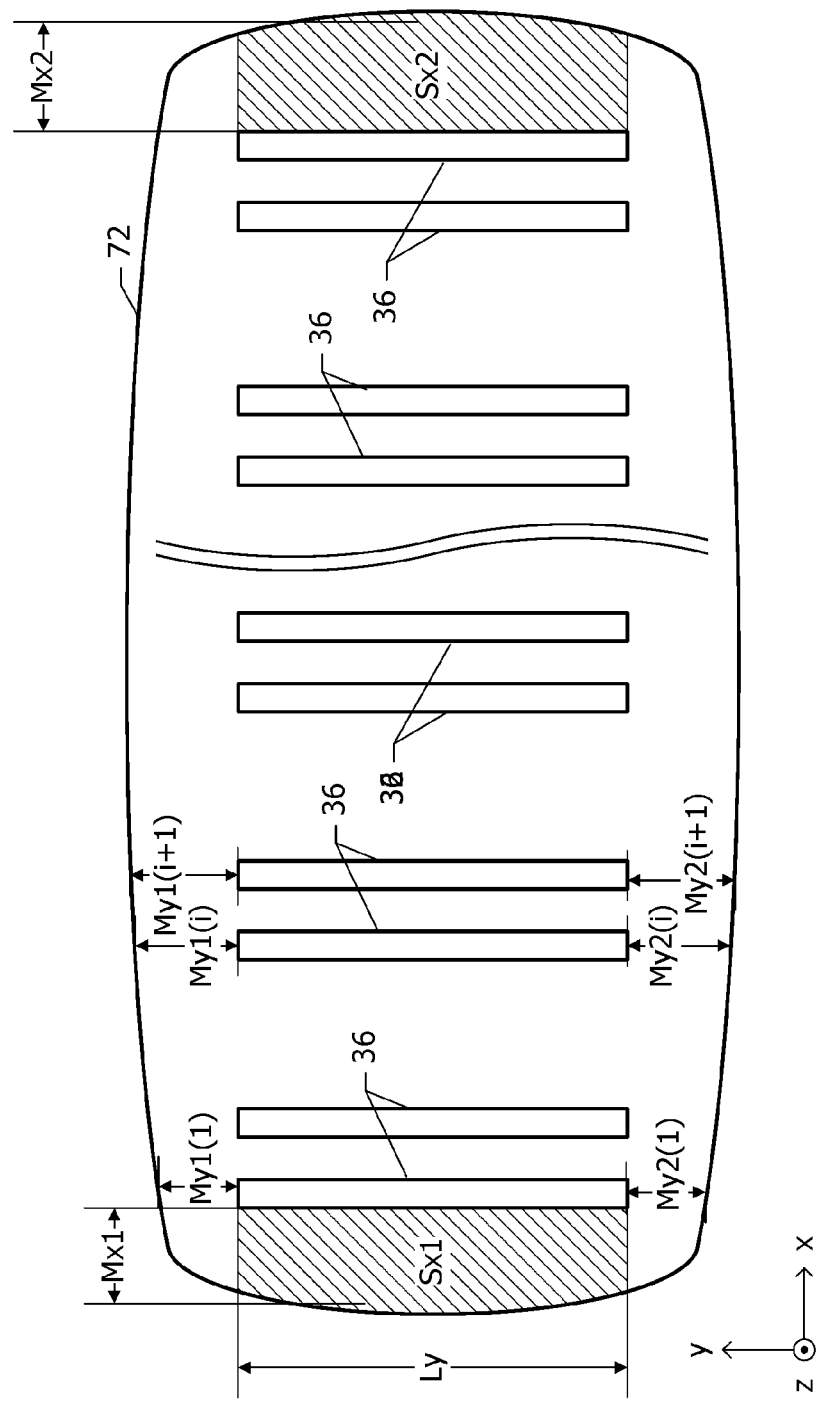
FIG. 11 is a diagram illustrating a planar positional relationship between an emitter contact region of a transistor disposed above a substrate of a semiconductor device according to a first modification of the second example, and a conductor pillar of a bump.

FIG. 11 is a diagram illustrating a planar positional relationship between the emitter contact region 36 of a transistor disposed above a substrate of a semiconductor device according to the first modification of the second example and the conductor pillar 72 of a bump. In the first modification, an area Sx1 of an end portion projecting region at one end in the x-axis direction is different from an area Sx2 of an end portion projecting region at another end. Thus, two third average distances Mx1 and Mx2 are obtained corresponding to the end portion projecting region having the area Sx1 and the end portion projecting region having the area Sx2 respectively. In this case, it is preferable that an average value of the third average distances Mx1 and Mx2 be set to be equal to or larger than the second average distance Mt.

For two edges extending in a longitudinal direction of the conductor pillar 72, a first average distance My1 obtained by averaging distances My1(i) in the y-axis direction from end portions of the respective emitter contact regions 36 at one edge to the edge of the conductor pillar 72 is different from a first average distance My2 obtained by averaging distances My2(i) in the y-axis direction from end portions of the respective emitter contact regions 36 at another edge to the edge of the conductor pillar 72. In this case, it is preferable that an average value of the first average distances My1 and My2 be set to be equal to or larger than the second average distance Mt.

Next, a second modification of the second example will be described with reference to FIG. 12.

Figure 12:
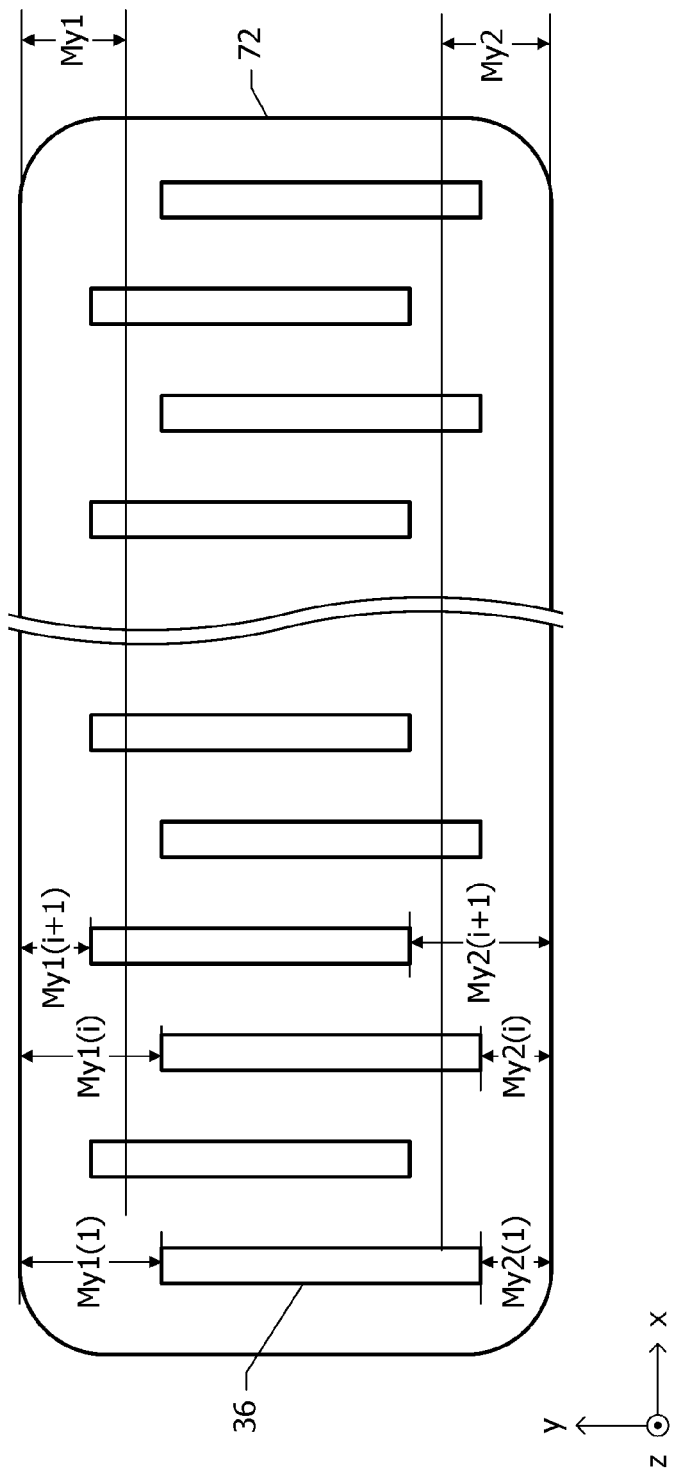
FIG. 12 is a diagram illustrating a planar positional relationship between an emitter contact region of a transistor disposed above a substrate of a semiconductor device according to a second modification of the second example, and a conductor pillar of a bump.

FIG. 12 is a diagram illustrating a planar positional relationship between the emitter contact region 36 of a transistor disposed above a substrate of a semiconductor device according to the second modification of the second example and the conductor pillar 72 of a bump. In the first example (FIG. 1) and the second example (FIG. 10), all of the emitter contact regions 36 are disposed at the same position with respect to the y-axis direction. Compared to this, in the second modification of the second example, respective positions of the plurality of emitter contact regions 36 in the y-axis direction are not aligned. For example, the even-numbered emitter contact regions 36 are shifted to a positive side of the y-axis from the odd-numbered emitter contact regions 36.

A value obtained by averaging the distances My1(i) in the y-axis direction from end portions of the respective emitter contact regions 36 at one edge extending in a longitudinal direction of the conductor pillar 72 to an edge of the conductor pillar 72 is defined as the first average distance My1. Similarly, a value obtained by averaging the distances My2(i) in the y-axis direction at another edge is defined as the first average distance My2. In this case, it is preferable that an average value of the first average distances My1 and My2 be set to be equal to or larger than the second average distance Mt.

Next, a third modification of the second example will be described with reference to FIG. 13.

Figure 13:
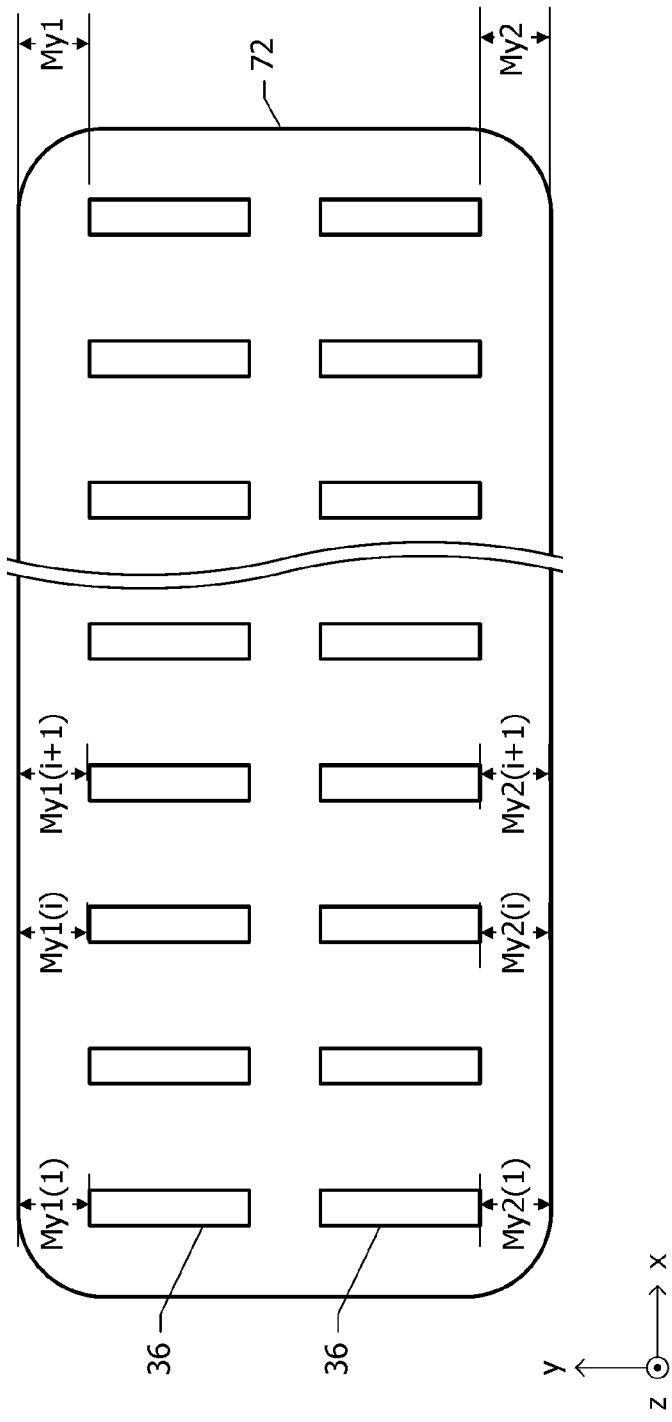
FIG. 13 is a diagram illustrating a planar positional relationship between an emitter contact region of a transistor disposed above a substrate of a semiconductor device according to a third modification of the second example, and a conductor pillar of a bump.

FIG. 13 is a diagram illustrating a planar positional relationship between the emitter contact region 36 of a transistor disposed above a substrate of a semiconductor device according to the third modification of the second example and the conductor pillar 72 of a bump. In the first example (FIG. 1) and the second example (FIG. 10), the plurality of emitter contact regions 36 is arrayed in one row in the x-axis direction. Compared to this, in the third modification of the second example, the plurality of emitter contact regions 36 is arranged in two rows in the x-axis direction. That is, two emitter contact regions 36 are arrayed in the y-axis direction. In addition, the upper mesa portions 31 (FIG. 2 and FIG. 3) are provided corresponding to the emitter contact regions 36, respectively.

When the distances My1($i$) and My2($i$) are determined, it is sufficient that a distance in the y-axis direction from an end portion of the emitter contact region 36 closer to an edge of interest of the conductor pillar 72 to the edge of interest is determined. When the distances My1($i$) are not constant, it is sufficient that an average value of the distances My1($i$) is adopted as the first average distance My1. Similarly, it is sufficient that an average value of the distances My2($i$) is adopted as the first average distance My2. When the first average distances My1 and My2 are different from each other, it is preferable that an average value of the two is set to be equal to or larger than the second average distance Mt.

Third Example

Next, a semiconductor device according to a third example will be described with reference to FIG. 14. Hereinafter, description for structure common to that of the semiconductor device according to the first example will be omitted.

Figure 14:
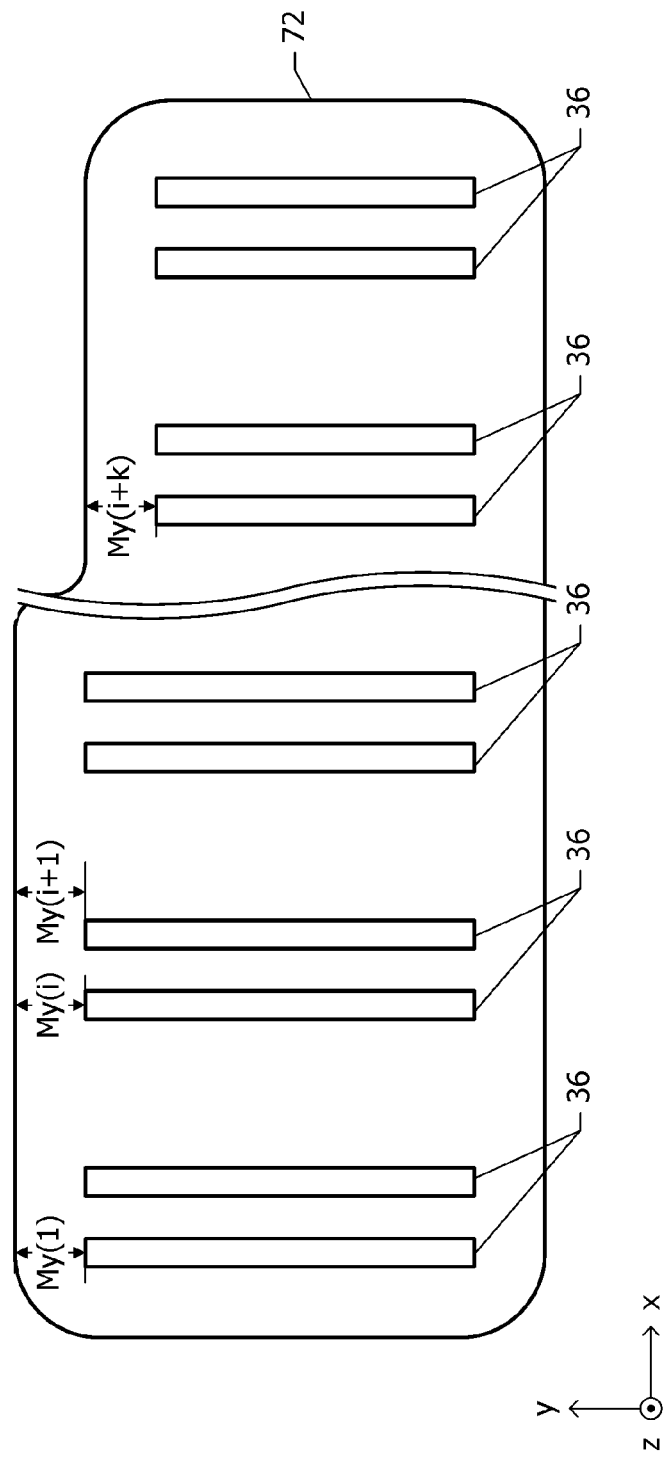
FIG. 14 is a diagram illustrating a planar positional relationship between a top surface of a mesa portion of a transistor disposed above a substrate of a semiconductor device according to a third example, and a conductor pillar of a bump.

FIG. 14 is a diagram illustrating a planar positional relationship between the emitter contact region 36 of a transistor disposed above a substrate of the semiconductor device according to the third example and the conductor pillar 72 of a bump. In the first example, the dimension in the y-axis direction of the plurality of emitter contact regions 36 contained in one conductor pillar 72 in plan view is constant. Compared to this, in the third example, the plurality of emitter contact regions 36 having different dimensions in the y-axis direction is disposed in one conductor pillar 72. For example, the plurality of emitter contact regions 36 is classified into two or more groups, a dimension of the emitter contact region 36 in the y-axis direction is constant in a group, and dimensions in the y-axis direction are different for the emitter contact regions 36 belonging to other groups.

Also in the third example, it is sufficient that the distances My(i) are determined for the respective emitter contact regions 36, and an average value of the distances My(i) is set to the first average distance My.

Fourth Example

Next, a semiconductor device according to a fourth example will be described with reference to FIG. 15. Hereinafter, description for structure common to that of the semiconductor device according to the first example will be omitted.

Figure 15:
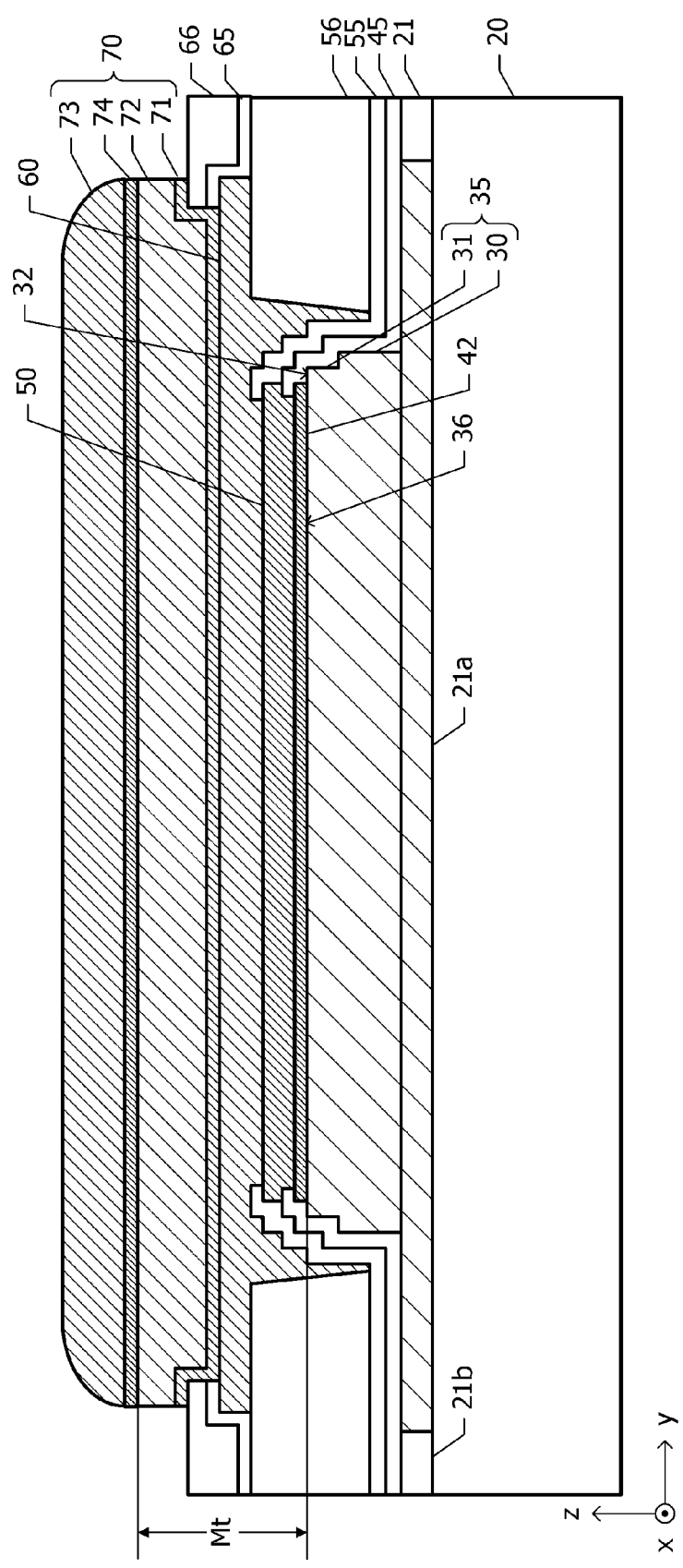
FIG. 15 is a sectional view of a semiconductor device according to a fourth example.

FIG. 15 is a sectional view of a semiconductor device according to the fourth example. In the first example, the conductor pillar 72 and the solder layer 73 of the bump 70 (FIG. 2 and FIG. 3) are in direct contact with each other. Compared to this, in the fourth example, a diffusion preventing layer 74 is disposed between the conductor pillar 72 and the solder layer 73. The diffusion preventing layer 74 has a function of preventing diffusion of solder from the solder layer 73 to the conductor pillar 72. For example, Ni is used for the diffusion preventing layer 74, and a thickness thereof is, for example, about 2 μm or more and about 3 μm or less (i.e., from about 2 μm to about 3 μm).

In the fourth example, it is preferable that, as the second average distance Mt, an average value of dimensions in the height direction from the emitter contact region 36 on the top surface 32 of the upper mesa portion 31 to an interface between the conductor pillar 72 and the diffusion preventing layer 74 be adopted.

Next, an advantage of the fourth example will be described. In the fourth example, since the diffusion preventing layer 74 is disposed, it is possible to suppress diffusion of solder in the conductor pillar 72 during flip chip bonding. As a result, an effect that reliability of the semiconductor device is enhanced can be obtained. In particular, a remarkable effect can be obtained when a dimension of the conductor pillar 72 in the height direction is reduced.

Fifth Example

Next, a semiconductor device according to a fifth example will be described with reference to FIG. 16 to FIG. 18. Hereinafter, description for structure common to that of the semiconductor device according to the first example will be omitted. In the first example, a GaAs-based HBT is used as the transistor 35. Compared to this, in the fifth example, a SiGe based HBT is used as a transistor.

Figure 16:
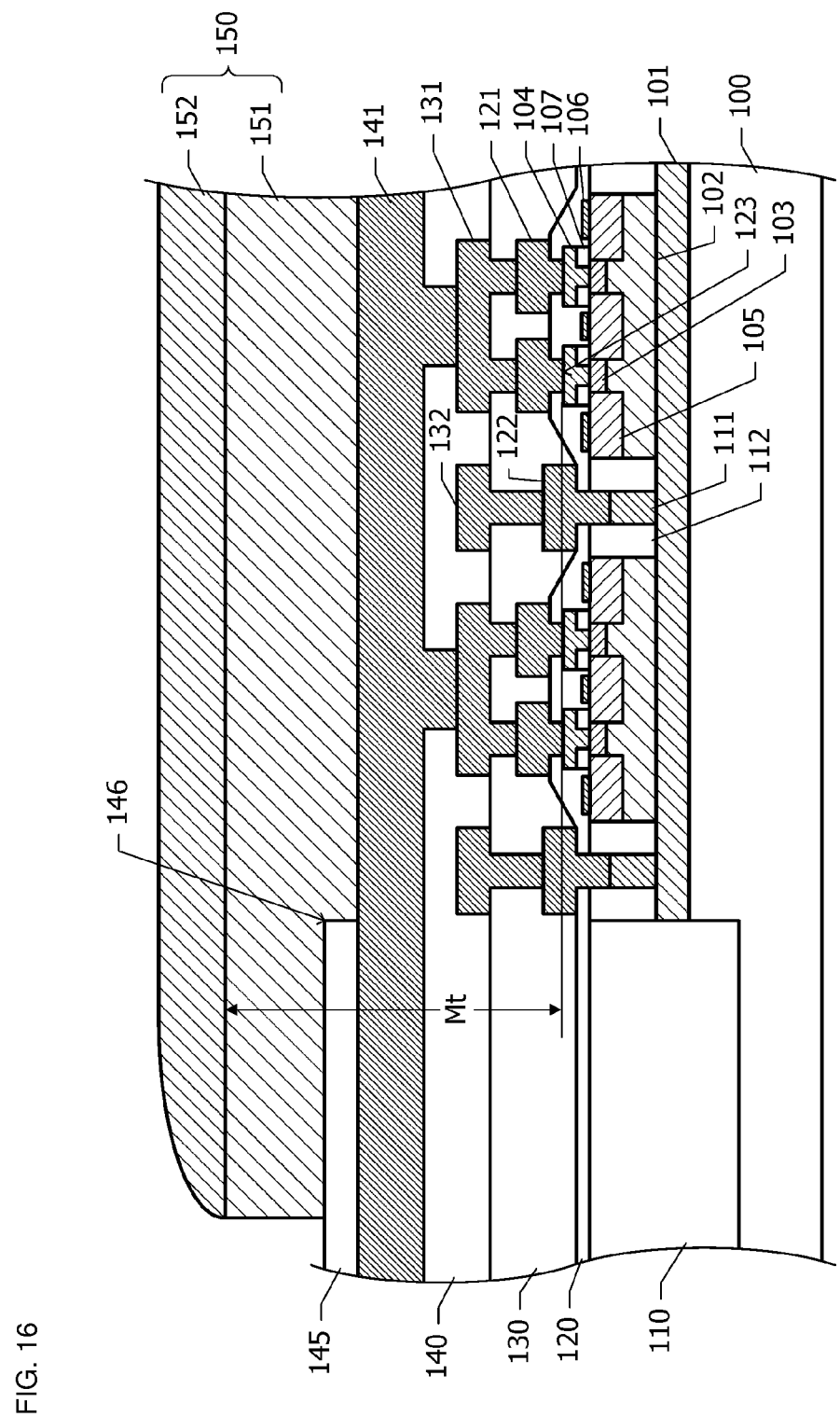
FIG. 16 is a sectional view of a semiconductor device according to a fifth example.
Figure 17:
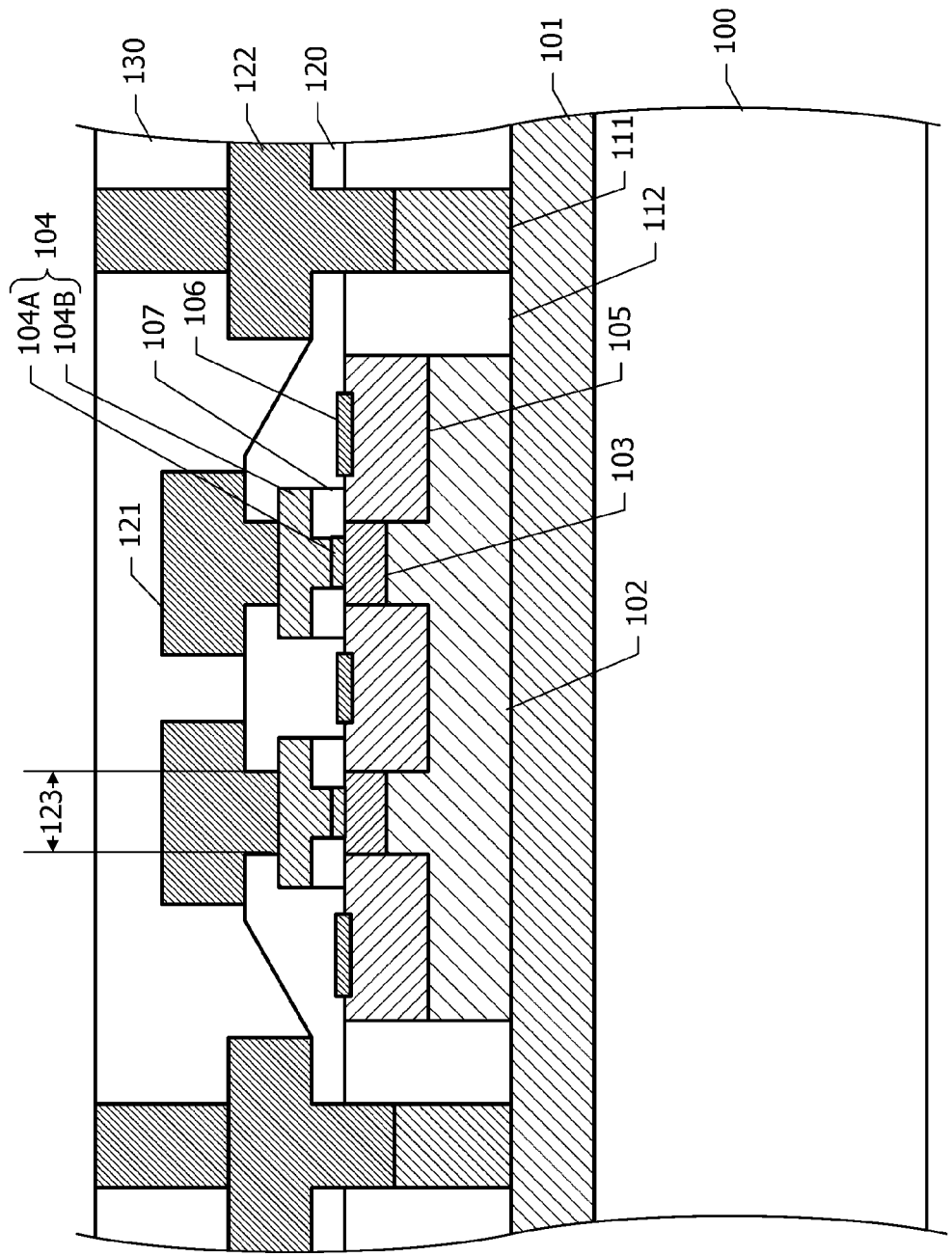
FIG. 17 is an enlarged sectional view of a transistor portion of the semiconductor device according to the fifth example.

FIG. 16 is a sectional view of the semiconductor device according to the fifth example. FIG. 17 is an enlarged sectional view of a transistor portion. Hereinafter, explanation will be given referring to FIG. 16 and FIG. 17 is referred to as necessary.

An element isolation insulating region 110 is formed on a surface layer portion of a substrate 100 made of p-type silicon, and an element formation region is defined by the element isolation insulating region 110. Shallow trench isolation (STI) structure or silicon local oxidation (LOCOS) structure is applied to the element isolation insulating region 110.

A sub-collector layer 101 made of high concentration n-type silicon is provided in an element formation region of the substrate 100. A plurality of collector layers 102 made of n-type silicon is disposed on some regions of the sub-collector layer 101. An $n^+$ region 111 made of high concentration silicon is disposed between the collector layers 102. An insulating region 112 is disposed between the $n^+$ region 111 and the collector layer 102.

A plurality of base layers 103 made of epitaxially grown p-type SiGe is disposed on part of a surface of each of the collector layers 102. For example, two base layers 103 are disposed for one collector layer 102. External base layers 105 made of p-type silicon are disposed on both sides of each of the base layers 103 respectively. A base electrode 106 is disposed on a surface of the external base layer 105. The base electrode 106 is formed of metal silicide such as Ti silicide or Ni silicide. The base electrode 106 is disposed for the purpose of reducing base resistance. It is also possible to employ structure in which the base electrode 106 is not provided, by omitting a manufacturing process.

An insulating film 107 made of silicon oxide or the like is disposed on the base layer 103 and the external base layer 105. In a region in which the base electrode 106 is disposed, the insulating film 107 is removed. Further, an opening is provided in the insulating film 107 to expose a surface of the base layer 103. An emitter layer 104 made of n-type silicon is disposed on the base layer 103 in the opening and on the insulating film 107.

The emitter layer 104 includes an intrinsic emitter layer 104A (FIG. 17) made of n-type silicon, and an external emitter layer 104B (FIG. 17) made of n-type polysilicon disposed thereon.

A first insulating film 120 made of silicon oxide is disposed so as to cover the emitter layer 104, the base layer 103, the base electrode 106, the element isolation insulating region 110, and the like. A plurality of openings exposing the emitter layer 104 and the $n^+$ region 111 is formed in the first insulating film 120. Emitter wiring 121 and collector wiring 122 of a first layer are disposed on the first insulating film 120. The emitter wiring 121 is electrically connected and is thermally connected to the emitter layer 104 through the opening provided in the first insulating film 120. A region in which the emitter layer 104 and the emitter wiring 121 are in contact with each other is referred to as an emitter contact region 123. The collector wiring 122 is electrically connected to the n+ region 111 through the opening provided in the first insulating film 120.

Although not illustrated in the section illustrated in FIG. 16, base wiring is disposed on the first insulating film 120, and the base wiring is electrically connected to the base electrode 106 through the opening provided in the first insulating film 120. Note that, in a case in which the base electrode 106 is not provided, it is sufficient that base wiring is directly connected to the external base layer 105.

The emitter wiring 121 and collector wiring 122 of the first layer and the base wiring are made of aluminum (Al), for example. Note that, an inside of the opening may be filled with Al being a wiring material, or may be filled with another metal such as tungsten (W).

A second insulating film 130 is disposed on the first insulating film 120, so as to cover the emitter wiring 121 and collector wiring 122 of the first layer and the base wiring. Emitter wiring 131 and collector wiring 132 of a second layer are disposed on the second insulating film 130. The emitter wiring 131 of the second layer is connected to the emitter wiring 121 of the first layer through an opening provided in the second insulating film 130. The collector wiring 132 of the second layer is connected to the collector wiring 122 of the first layer through an opening provided in the second insulating film 130. For example, metal such as Al or copper (Cu) is used for the emitter wiring 131 and collector wiring 132 of the second layer.

A third insulating film 140 is disposed on the second insulating film 130, so as to cover the emitter wiring 131 and collector wiring 132 of the second layer. For example, metal such as Al or Cu is used for emitter wiring 141 of a third layer. The emitter wiring 141 of the third layer is disposed on the third insulating film 140. The emitter wiring 141 of the third layer is connected to the emitter wiring 131 of the second layer through an opening provided in the third insulating film 140.

A protective film 145 is disposed above the third insulating film 140 so as to cover the emitter wiring 141 of the third layer. The second insulating film 130, the third insulating film 140, and the protective film 145 are formed of a SiN or SiO based insulating material. If necessary, an upper surface of the insulating film is planarized.

The protective film 145 has an opening 146 for bump contact. A bump 150 is disposed on the emitter wiring 141 in the opening 146 and on the protective film 145 around the opening 146.

Figure 18:
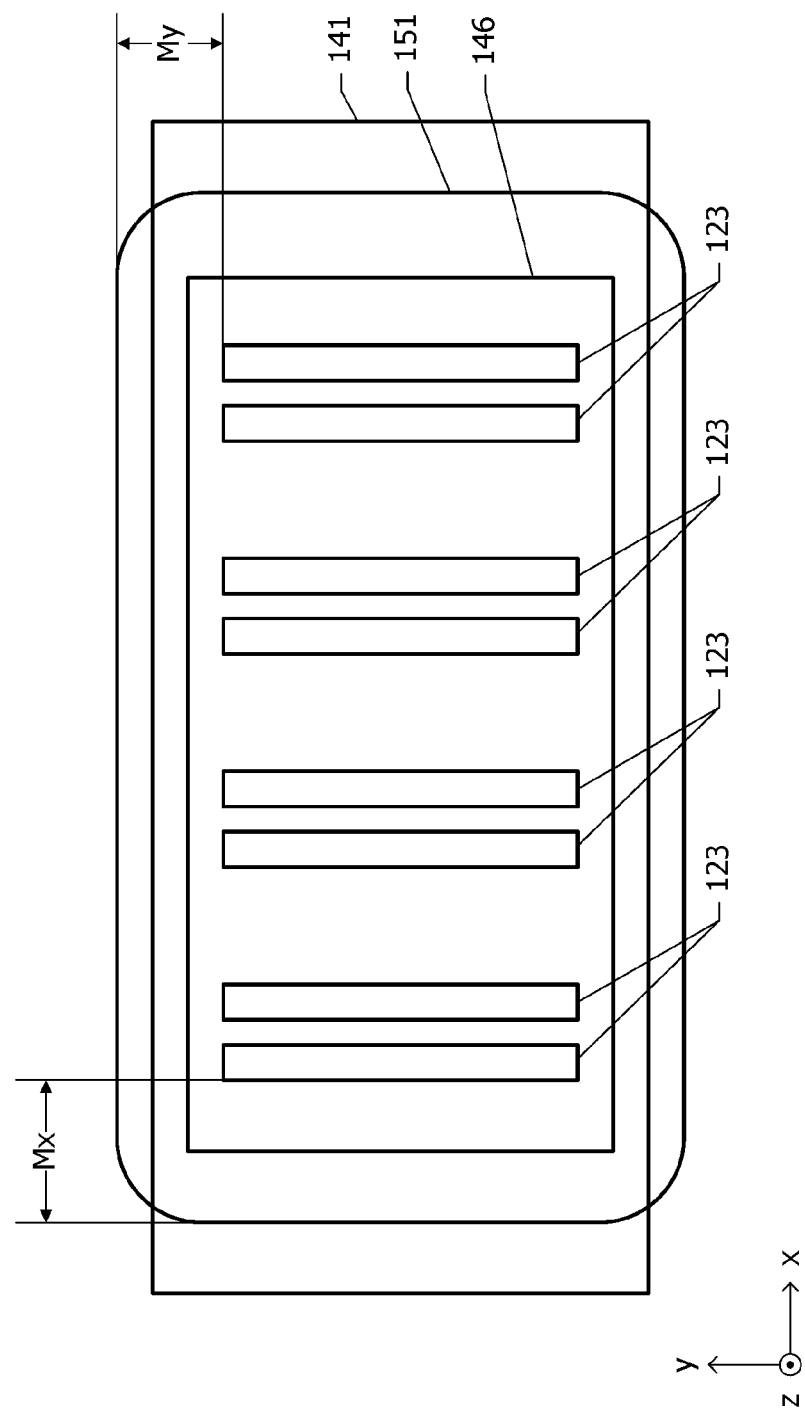
FIG. 18 is a diagram illustrating a planar positional relationship among an emitter contact region of the semiconductor device according to the fifth example, emitter wiring of a third layer, an opening for a bump, and a conductor pillar of the bump (FIG. 16).

FIG. 18 is a diagram illustrating a planar positional relationship among the emitter contact region 123, the emitter wiring 141 of the third layer, the opening 146 for the bump, and a conductor pillar 151 of the bump 150 (FIG. 16), of the semiconductor device according to the fifth example.

Each of a plurality of the emitter contact regions 123 has a planar shape long in one direction, and the plurality of emitter contact regions 123 is arranged in a width direction. An xyz orthogonal coordinate system is defined in which the width direction of the emitter contact region 123 is an x-axis direction and a longitudinal direction is a y-axis direction. In plan view, the plurality of emitter contact regions 123 is disposed inside the emitter wiring 141 of the third layer. The opening 146 for the bump is disposed inside the emitter wiring 141 of the third layer. The opening 146 for the bump contains the plurality of emitter contact regions 123 in plan view. The conductor pillar 151 is disposed so as to contain the opening 146 for the bump.

The emitter contact region 123 and the conductor pillar 151 correspond to the emitter contact region 36 and the conductor pillar 72 of the semiconductor device according to the first example (FIG. 1), respectively. In the fifth example as well, the first average distance My and the third average distance Mx can be defined by a positional relationship between the emitter contact region 123 and the conductor pillar 151. Further, as illustrated in FIG. 16, the second average distance Mt can be defined based on the height from the emitter contact region 123 to an upper surface of the conductor pillar 151.

Also in the fifth example, the first average distance My, the second average distance Mt, and the third average distance Mx are set to have a similar relationship to that in the case of the first example, so that a semiconductor device having excellent heat dissipation characteristics can be obtained. As a result, it is possible to maintain good electrical characteristics.

When the first average distance is set to be equal to or larger than the second average distance, the conductor pillar functions effectively as a heat spreader. As a result, heat dissipation from the contact region of the transistor can be enhanced.

Needless to say, the above-described examples are merely examples and that partial replacement or combination of the configurations shown in different examples is possible. Similar effects of the same configuration of the examples will not be described in order for each example. Furthermore, the present disclosure is not limited to the examples described above. For example, it will be apparent to those skilled in the art that various changes, modifications, combinations and the like may be made.

While preferred embodiments of the disclosure have been described above, it is to be understood that variations and modifications will be apparent to those skilled in the art without departing from the scope and spirit of the disclosure. The scope of the disclosure, therefore, is to be determined solely by the following claims.

What is claimed is:

1. A semiconductor device, comprising:
    a substrate;
    a plurality of transistors provided above the substrate, and including semiconductor regions through which an operating current flows;
    a plurality of operating electrodes made of a conductive material having a higher thermal conductivity than a thermal conductivity of the plurality of the semiconductor regions, the plurality of operating electrodes being in contact with the plurality of semiconductor regions respectively to conduct the operating current to the plurality of the semiconductor regions; and
    a conductor pillar for external connection electrically connected to the plurality of operating electrodes and containing a plurality of contact regions in which the plurality of semiconductor regions and the plurality of operating electrodes are in contact with each other in plan view, wherein
    the plurality of contact regions is arrayed in a first direction, each of the plurality of contact regions has a planar shape that is long in a second direction orthogonal to the first direction, and a first average distance is equal to or larger than a second average distance, the first average distance being a value obtained by averaging, across the plurality of contact regions, distances in the second direction from respective end portions of the plurality of contact regions in the second direction to an edge of the conductor pillar, the second average distance being an average value of distances in a height direction from the plurality of contact regions to a top surface of the conductor pillar.

2. The semiconductor device according to claim 1, wherein a third average distance is equal to or larger than the second average distance, the third average distance being an average value of distances in the first direction from a contact region, among the plurality of contact regions, located at an end portion in the first direction to an edge of the conductor pillar.

3. The semiconductor device according to claim 2, wherein the first average distance is equal to or larger than the third average distance.

4. The semiconductor device according claim 3, further comprising:
   a solder layer disposed above the conductor pillar; and
   a diffusion preventing layer disposed between the conductor pillar and the solder layer and preventing diffusion of solder.

5. The semiconductor device according claim 2, further comprising:
   a solder layer disposed above the conductor pillar; and
   a diffusion preventing layer disposed between the conductor pillar and the solder layer and preventing diffusion of solder.

6. The semiconductor device according to claim 1, further comprising:
   a solder layer disposed above the conductor pillar; and
   a diffusion preventing layer disposed between the conductor pillar and the solder layer and preventing diffusion of solder.

7. The semiconductor device according to claim 1, wherein a planar shape of the conductor pillar is substantially rectangular with round corners.

8. The semiconductor device according to claim 1, wherein a planar shape of the conductor pillar is a shape with short sides and long sides of a rectangle curved outward.

9. The semiconductor device according to claim 8, wherein each of a plurality of third average distances is equal to or larger than the second average distance, a first one of the third average distances being an average value of distances in the first direction from a first contact region, among the plurality of contact regions, located at a first end portion in the first direction to a first edge of the conductor pillar, and a second one of the third average distances being an average value of distances in the first direction from a second contact region, among the plurality of contact regions, located at a second end portion in the first direction to a second edge of the conductor pillar opposite to the first edge, the first one of the third average distances being different than the second one of the third average distances.

10. The semiconductor device according to claim 8, wherein the plurality of contact regions are shifted with respect to each other in the second direction.

11. The semiconductor device according to claim 8, wherein the plurality of contact regions are arrayed in two rows in the first direction.

12. The semiconductor device according to claim 8, wherein the conductor pillar has a varied dimension in the second direction.

13. The semiconductor device according to claim 12, wherein at least one of the contact regions has a dimension different in the second direction than a dimension of an other of the contact regions in the second direction.

14. The semiconductor device according to claim 8, further comprising
   a protective film having an opening therein through which a portion of the conductor pillar extends to connect to the plurality of operating electrodes.

15. The semiconductor device according to claim 1, wherein the plurality of contact regions are shifted with respect to each other in the second direction.

16. The semiconductor device according to claim 1, wherein the plurality of contact regions are arrayed in two rows in the first direction.

17. The semiconductor device according to claim 1, wherein the conductor pillar has a varied dimension in the second direction.

18. The semiconductor device according to claim 17, wherein at least one of the contact regions has a dimension different in the second direction than a dimension of an other of the contact regions in the second direction.

19. The semiconductor device according to claim 1, further comprising
   a protective film having an opening therein through which a portion of the conductor pillar extends to connect to the plurality of operating electrodes.

20. The semiconductor device according to claim 19, wherein the contact regions are positioned within the opening in plan view.

* * * * *